US012677470B2

(12) United States Patent
Chen et al.

(10) Patent No.: US 12,677,470 B2
(45) Date of Patent: Jul. 7, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Ren-Kai Chen, Hsinchu County (TW); Li-Chen Lee, Taoyuan City (TW); Ying-Liang Chuang, Hsinchu County (TW); Ming-Hsi Yeh, Hsinchu (TW); Kuo-Bin Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 538 days.

(21) Appl. No.: 17/726,522

(22) Filed: Apr. 21, 2022

(65) Prior Publication Data

US 2023/0343820 A1     Oct. 26, 2023

(51) Int. Cl.
H10D 84/01          (2026.01)
H10D 30/01          (2025.01)
(Continued)

(52) U.S. Cl.
CPC ......... H10D 84/013 (2025.01); H10D 30/031 (2025.01); H10D 30/6713 (2025.01); H10D 30/6729 (2025.01); H10D 30/6735 (2025.01); H10D 30/6757 (2025.01); H10D 62/118 (2025.01); H10D 64/01125 (2026.01); H10D 64/017 (2025.01); H10D 84/0128 (2025.01);
(Continued)

(58) Field of Classification Search
None
See application file for complete search history.

(56) References Cited

U.S. PATENT DOCUMENTS 6,593,217 B1 *   7/2003   Fujisawa ........... H01L 21/28518
                                                      257/E21.252
8,772,109 B2     7/2014   Colinge
                          (Continued)

OTHER PUBLICATIONS

Christensen et al, 2013, 'Formation of nickel-platinum silicides on a silicon substrate: Structure, phase stability, and diffusion from ab initio computations', J. Appl. Phys., vol. 114, pp. 033533-1 to 033533-11. (Year: 2013).*

*Primary Examiner* — Feifei Yeung Lopez
(74) *Attorney, Agent, or Firm* — JCIPRNET

(57)          ABSTRACT

A method of forming a semiconductor device includes forming an epitaxial source/drain (S/D) structure adjacent to a gate structure; forming a dielectric structure over the gate and epitaxial S/D structures; forming a trench in the dielectric structure to accessibly expose a portion of the epitaxial S/D structure; forming a contact feature from the portion of the epitaxial S/D structure within the trench; and forming a S/D contact in the trench to be in contact with the contact feature overlying the epitaxial S/D structure. Forming the contact feature includes forming a metallic layer in the trench; performing a thermal process on the metallic layer to form the contact feature, where after the thermal process, metallic residues remain on a sidewall of a spacer of the dielectric structure in the trench; and removing the metallic residues by using a wet etching process, wherein the spacer of the dielectric structure remains substantially intact.

20 Claims, 12 Drawing Sheets

(51) Int. Cl.

| | |
|---|---|
| *H10D 30/67* | (2025.01) |
| *H10D 62/10* | (2025.01) |
| *H10D 64/01* | (2025.01) |
| *H10D 84/03* | (2025.01) |

(52) U.S. Cl.
CPC ....... *H10D 84/0147* (2025.01); *H10D 84/038* (2025.01)

(56)                    References Cited

U.S. PATENT DOCUMENTS

| | | | |
|---|---|---|---|
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,963,258 B2 | 2/2015 | Yu et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,209,247 B2 | 12/2015 | Colinge et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,548,303 B2 | 1/2017 | Lee et al. | |
| 9,576,814 B2 | 2/2017 | Wu et al. | |
| 9,608,116 B2 | 3/2017 | Ching et al. | |
| 2005/0202664 A1* | 9/2005 | Jawarani | H01L 29/665 |
| | | | 438/592 |
| 2010/0320510 A1* | 12/2010 | Loh | H01L 21/28518 |
| | | | 257/E21.409 |
| 2015/0129543 A1* | 5/2015 | Yamamoto | C23F 3/06 |
| | | | 216/38 |
| 2015/0187762 A1* | 7/2015 | Wahl | H10D 30/014 |
| | | | 438/131 |
| 2016/0064483 A1* | 3/2016 | Kelly | H01L 29/41791 |
| | | | 438/283 |
| 2017/0271514 A1* | 9/2017 | Kittl | H01L 29/30604 |
| 2018/0151565 A1* | 5/2018 | Lee | H01L 29/665 |
| 2019/0273023 A1* | 9/2019 | Loh | H01L 27/0886 |
| 2021/0118676 A1* | 4/2021 | Kusumoto | H10B 12/50 |

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
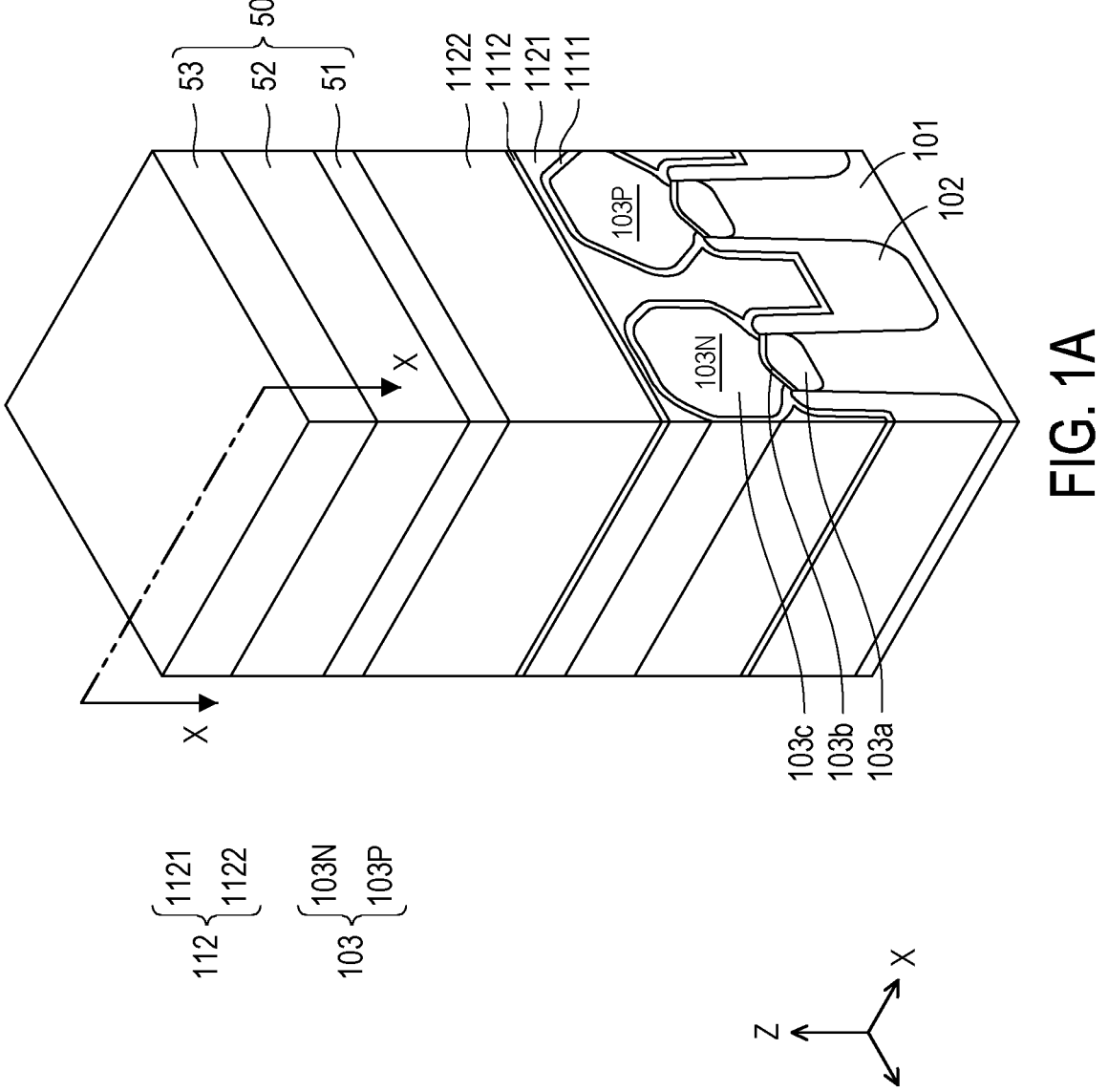
FIGS. 1A, 2A, 3A, and 5A are perspective views schematically illustrating various stages of a manufacturing method of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicide processes have been used to improve the conductivity of gate and source/drain (S/D) electrodes at the transistor level of an integrated circuit. Silicide features provide a good ohmic contact at the interface of the gate and S/D electrodes and the metal interconnects, reducing the contact resistance of the electrodes. Advanced semiconductor fabrication processes use nickel alloy silicide, especially nickel platinum (NiPt) silicide, due to their low processing temperature, low silicon consumption, good resistance behavior, and low electrical resistivity. However, platinum is difficult to etch, resulting in platinum residue issues during the removal of the unreacted metal layer. In some cases, aqua regia (i.e. an etching solution including $HNO_3$+HCl) is used to remove unreacted NiPt and Pt residues. However, as the concentration of Pt increases, aqua regia alone does not achieve complete removal of Pt residues. In addition, aqua regia has extreme corrosion; therefore, it still is not the dominant choice under safety concern. Alternative chemistries for etching platinum in NiPt silicide formation include sulfuric acid solutions, such as sulfuric peroxide mixture (SPM). However, SPM fails to provide adequate cleaning performance without attacking SiN spacers. Therefore, what is needed is etch solutions and methods that allows for the safe removal of advanced materials (e.g., nickel and platinum) during semiconductor processing and manufacturing.

FIGS. 1A, 2A, 3A, and 5A are perspective views schematically illustrating various stages of a manufacturing method of a semiconductor device, FIGS. 1B, 2B, 3B, and 5B are schematic cross-sectional views of the semiconductor device along the Y-direction, where FIGS. 1B, 2B, 3B, and 5B correspond to FIGS. 1A, 2A, 3A, and 5A, respectively, FIGS. 1C, 2C, 3C, 4A-4C, and 5C are schematic cross-sectional views of the semiconductor device along the Y-direction, where FIGS. 1C, 2C, 3C, and 5C correspond to FIGS. 1A, 2A, 3A, and 5A, respectively, in accordance with some embodiments. These figures illustrate a manufacturing method of forming one or more nanostructure transistor device which may include a gate structure wrapping around the perimeter of one or more nanostructures (i.e. channel regions) for improved control of channel current flow. However, some embodiments contemplate aspects which may be used in planar devices, such as planar FETs, or in fin field-effect transistors (FinFETs) and/or any other suitable type and configuration of transistor device. In addition, a number of other devices (e.g., inductors, fuses, capacitors, coils, and/or the like) are not shown in these figures for purposes of clarity of illustration. Throughout the various views and illustrative embodiments of the present invention, like reference numbers are used to designate like elements.

Figures 1B, 1C:
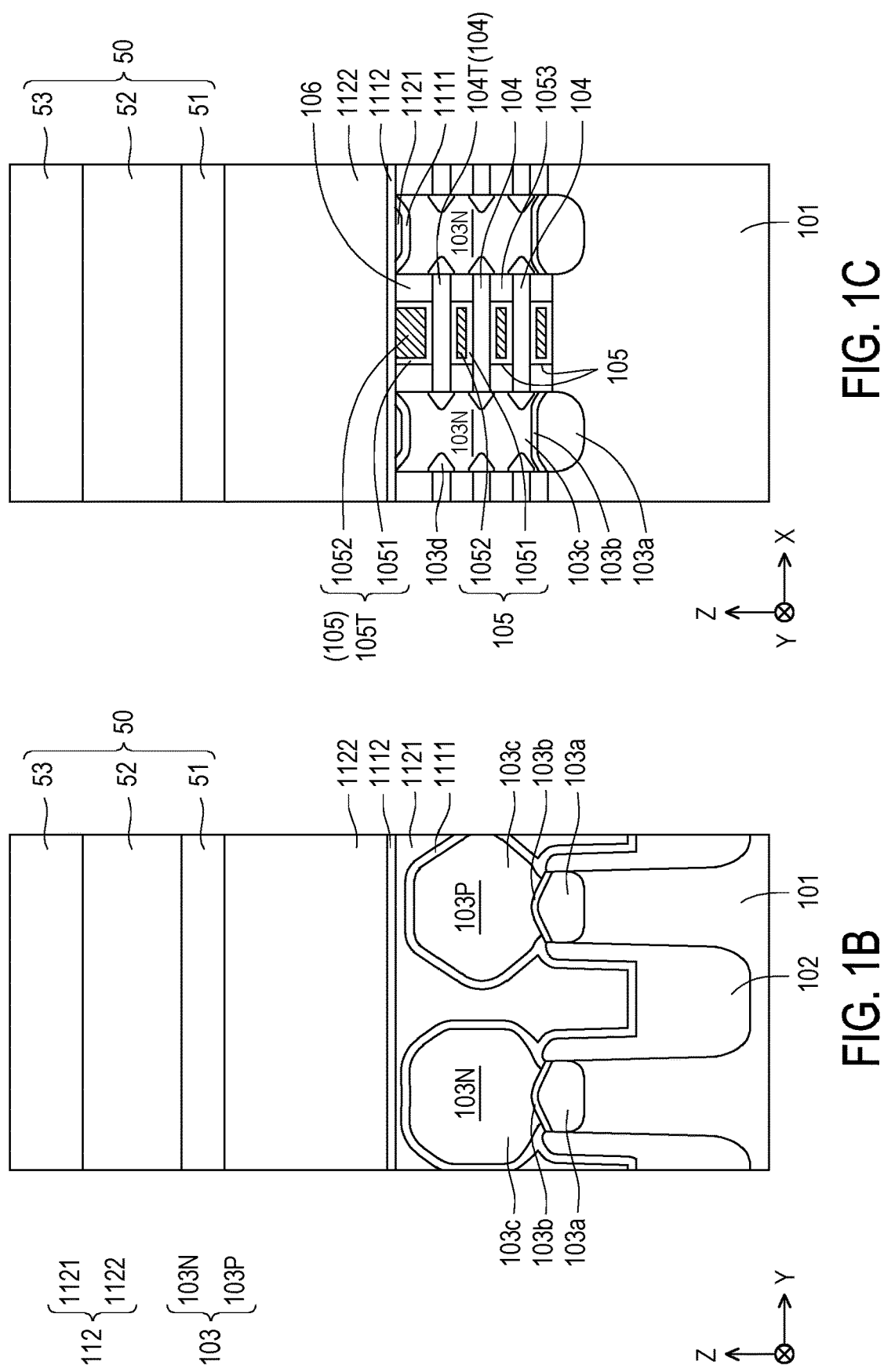
FIGS. 1B, 2B, 3B, and 5B are schematic cross-sectional views of the semiconductor device along the Y-direction, where FIGS. 1B, 2B, 3B, and 5B correspond to FIGS. 1A, 2A, 3A, and 5A, respectively, in accordance with some embodiments.
FIGS. 1C, 2C, 3C, 4A-4C, and 5C are schematic cross-sectional views of the semiconductor device along the Y-direction, where FIGS. 1C, 2C, 3C, and 5C correspond to FIGS. 1A, 2A, 3A, and 5A, respectively, in accordance with some embodiments.

Referring to FIGS. 1A-1C, a nanostructure transistor device includes a semiconductor substrate 101 and a number of semiconductor channel layers 104 that may contain semiconductor nanostructures (also called nanosheets or nanowires) above the semiconductor substrate 101. The semiconductor channel layers 104 (which may sometimes be collectively referred to as channel regions) are vertically separated from one another as shown in the X-Z cross section of FIG. 1C. Isolation structures 102 (also called shallow trench isolation (STI) regions) may be formed on opposing ends of a protruded portion of the semiconductor substrate 101. In some embodiments, gate structures 105 are stacked over the semiconductor channel layers 104 in alternating manner, where the topmost gate structure 105T is disposed on the topmost semiconductor channel layer 104T as shown in the X-Z cross section of FIG. 1C. It is noted that the X-Z cross section of FIG. 1C is taken along the line X-X outlined in FIG. 1A. In a certain Y-Z cross section (not shown), the gate structure 105 may wraps around the perimeter of one or more semiconductor channel layers 104, and thus the nanostructure transistor device is referred to as a gate-all-around (GAA) transistor device. Epitaxial structures 103 (e.g., 103N and 103P) which may include source and drain regions are disposed on opposing sides of the gate structure 105. A dielectric structure including one or more interlayer dielectric (ILD) layer(s) 112 and etch stop layer(s) may be disposed over the epitaxial structures 103 and in between the epitaxial structure 103 and the isolation structure 102.

In some embodiments, the semiconductor substrate 101 may be a bulk semiconductor, a semiconductor-on-insulator (SOI) substrate, or the like, which may be doped (e.g., with a p-type or an n-type dopant) or un-doped. The semiconductor substrate 101 may be a wafer, such as a silicon wafer. Other substrates, such as a multi-layered or gradient substrate may also be used. The material of the semiconductor substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, the semiconductor substrate 101 has an n-type region and a p-type region (not individually labeled), where the n-type region may be for forming n-type devices, such as NMOS transistors (e.g., n-type nano-FETs), and the p-type region may be for forming p-type devices, such as PMOS transistors (e.g., p-type nano-FETs). The n-type region may be physically separated from the p-type region, and any number of device features (e.g., other active devices, doped regions, isolation structures, or the like; not shown) may be disposed between the n-type region and the p-type region.

In some embodiments, the epitaxial structures 103N (or 103P) in the n-type region (or p-type region) may be formed by masking the p-type region (or n-type region). Then, the epitaxial structures 103N (or 103P) are epitaxially grown in the n-type region (or p-type region). The epitaxial structures 103N (or 103P) may include any acceptable material appropriate for n-type nano-FETs (or p-type nano-FETs). The epitaxial structures 103 may include one or more semiconductor material layers. Any number of semiconductor material layers may be used for the epitaxial structures 103. For example, the epitaxial structures 103 may include a first semiconductor material layer 103a, a second semiconductor material layer 103b, a third semiconductor material layer 103c, and an optional fourth semiconductor material layer 103d.

In some embodiments, each of the semiconductor material layers (e.g., 103a, 103b, 103c, and 103d) may be formed of different semiconductor materials and may be doped to different dopant concentrations. For example, the first semiconductor material layer 103a has a dopant concentration less than the other semiconductor material layers (e.g., 103b, 103c, and 103d). In embodiments in which the epitaxial structures 103 includes multiple semiconductor material layers, the first semiconductor material layer 103a may be deposited, the second semiconductor material layer 103b may be deposited over the first semiconductor material layer 103b, and the third semiconductor material layer 103c may be deposited over the second semiconductor material layer 103b. In some embodiments, the fourth semiconductor layer 103d is formed after the forming the second semiconductor material layer 103b and prior to the formation of the third semiconductor material layer 103c, and the fourth semiconductor layer 103d may be formed on the sidewalls of the semiconductor channel layers 104.

In some embodiments, a first etch stop layer (ESL) 1111 is disposed between the first ILD layer 1121 and the epitaxial structures 103 and also between the first ILD layer 1121 and the isolation structures 102 as shown in the Y-Z cross section of FIG. 1B. In some embodiments, a second ILD layer 1122 is disposed over the first ILD layer 1121 with a second ESL 1112 interposed therebetween. In some embodiments, the first ILD layer 1121 and the second ILD layer 1122 are formed of a dielectric material such as silicon oxide, phosphosilicate glass (PSG), borosilicate glass (BSG), boron-doped phosphosilicate Glass (BPSG), undoped silicate glass (USG), or any other suitable material. The first ESL 1111 and the second ESL 1112 may include a dielectric material, such as, silicon nitride, silicon oxide, silicon oxynitride, or the like, having a different etch rate than the materials of the overlying first ILD layer 1121 and the second ILD layer 1122.

In the X-Z cross section of FIG. 1C, the gate structures 105 and the semiconductor channel layers 104 are alternatingly disposed on top of one another (e.g., along the Z direction) to form a stack. The stack is between respective neighboring pairs of the epitaxial structures (e.g., 103N or 103P). The semiconductor channel layers 104 in both the n-type region and the p-type region may have a same material composition (e.g., silicon, or other suitable semiconductor channel material). The respective gate structure 105 may at least include a gate metal layer 1052 wrapped by a gate dielectric layer 1051, except for the topmost gate structure 105T. For example, the gate dielectric layer 1051 is formed along a top surface, sidewalls, and a bottom surface of the gate metal layer 1052. For the topmost gate structure 105T, the top surfaces of the gate metal layer 1052 and the gate dielectric layer 1051 may be substantially leveled with one another after a planarization process. In some embodiments, each gate structure 105 further includes an interfacial layer interposed between the semiconductor channel layer 104 and the gate dielectric layer 1051. In some embodiments, the gate dielectric layer 1051 includes one or more dielectric layers, such as an oxide, a metal oxide, the like, or combinations thereof. The gate metal layer 1052 may include a stack of multiple metal materials.

In some embodiments, each gate structure 105 includes one or more work function sublayers interposed between the gate dielectric layer 1051 and the gate metal layer 1052. The gate metal layer 1052 may include p-type work function sublayer(s) or n-type work function sublayer(s). The work function sublayers may be formed separately for the n-type FET and the p-type FET which may use different metal layers. Example p-type work function metal sublayer that may include TIN, TaN, Ru, Mo, Al, WN, $ZrSi_2$, $MoSi_2$, $TaSi_2$, $NiSi_2$, WN, other suitable p-type work function materials, or combinations thereof. Example n-type work function metal sublayer that may include Ti, Ag, TaAl, TaAlC, TiAlN, TaC, TaCN, TaSiN, Mn, Zr, other suitable n-type work function materials, or combinations thereof. In some embodiments, the gate structures 105 below the topmost gate structure 105T is laterally covered by inner spacers 1053. The inner spacers 1053 act as isolation features between the source/drain regions (i.e. epitaxial structures 103) and the gate structures 105. For example, the inner spacers 1053 is formed of silicon nitride, silicoboron carbonitride, silicon carbonitride, silicon carbon oxynitride, or any other type of dielectric material appropriate to the role of forming an insulating gate sidewall spacers of transistors.

In some embodiments, gate spacers 106 laterally surround the respective topmost gate structure 105T. The bottom surfaces of the gate spacers 106 may be in contact with the underlying topmost semiconductor channel layer 104T. The gate spacers 106 may be disposed laterally between the topmost gate structure 105T and the adjacent epitaxial structures 103. The gate spacers 106 may be low-k spacers and may be formed of a suitable dielectric material, such as silicon oxide, silicon oxycarbonitride, or the like. In the X-Z cross section of FIG. 1C, the top surfaces of the gate spacers 106 may be substantially leveled with the top surface of the gate structure 105T. The top surfaces of the gate spacers 106 may be substantially leveled with the top surfaces of the first ILD layer 1121 and that first ESL 1111 which overlay the epitaxial structure 103.

With continued reference to FIGS. 1A-1C, a hard mask structure 50 may be formed over the second ILD layer 1122 of the dielectric structure. In some embodiments, the hard mask structure 50 includes a plurality of sublayers that provide for different oxidation rates and/or different etch selectivity between the layers. For example, the hard mask structure 50 includes a first sublayer 51 overlying the second ILD layer 1122, a second sublayer 52 overlying the first sublayer 51, and a third sublayer 53 overlying the second sublayer 52. The first, second, and third sublayers (51, 52, and 53) may be or may include an oxide material (e.g., silicon oxide), a nitrogen-containing material (e.g., silicon nitride, silicon oxynitride, or the like), an amorphous carbon material, silicon carbide, combinations thereof, other suitable materials, and/or the like.

Figure 2A:
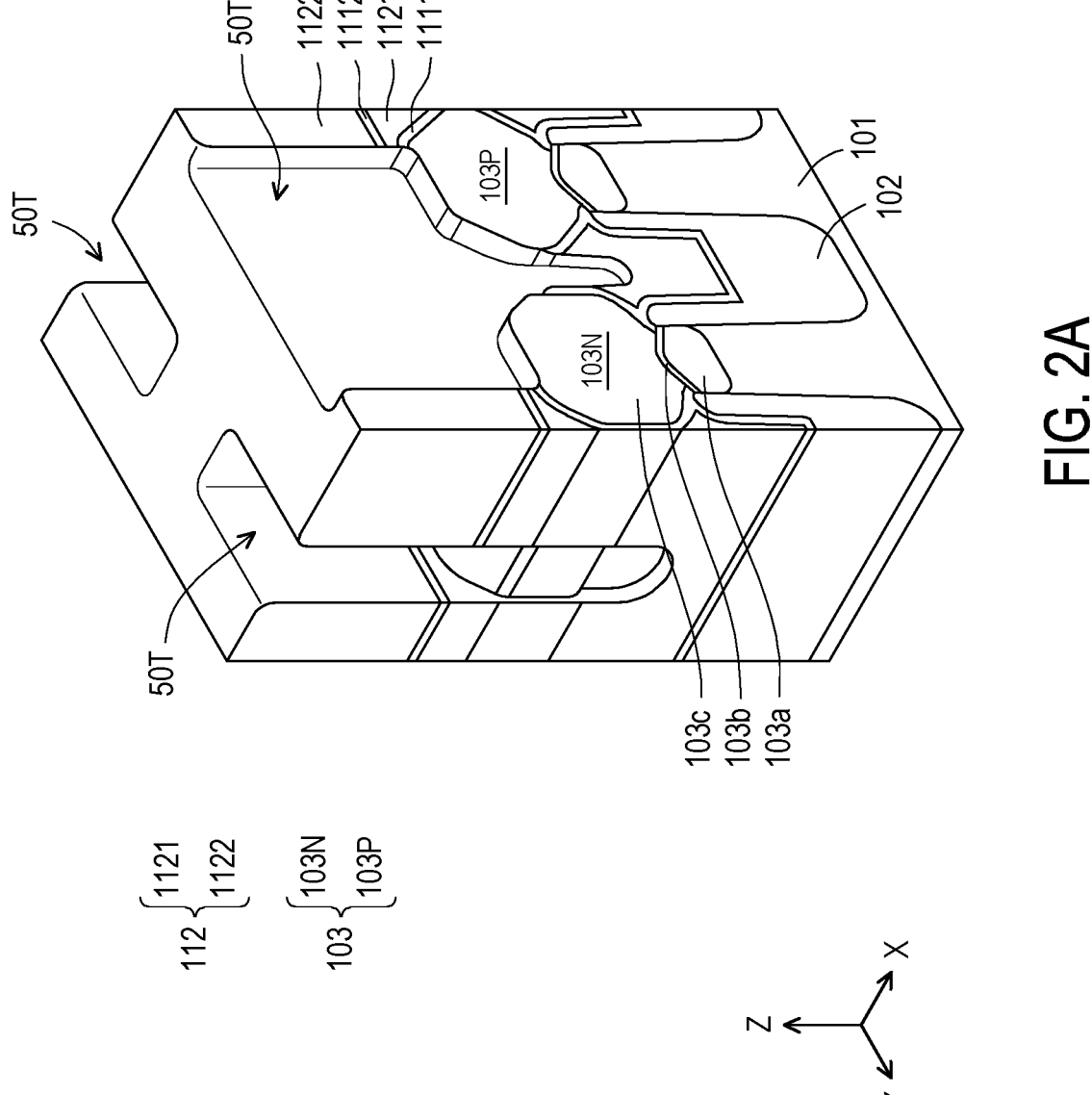
Figures 2B, 2C:
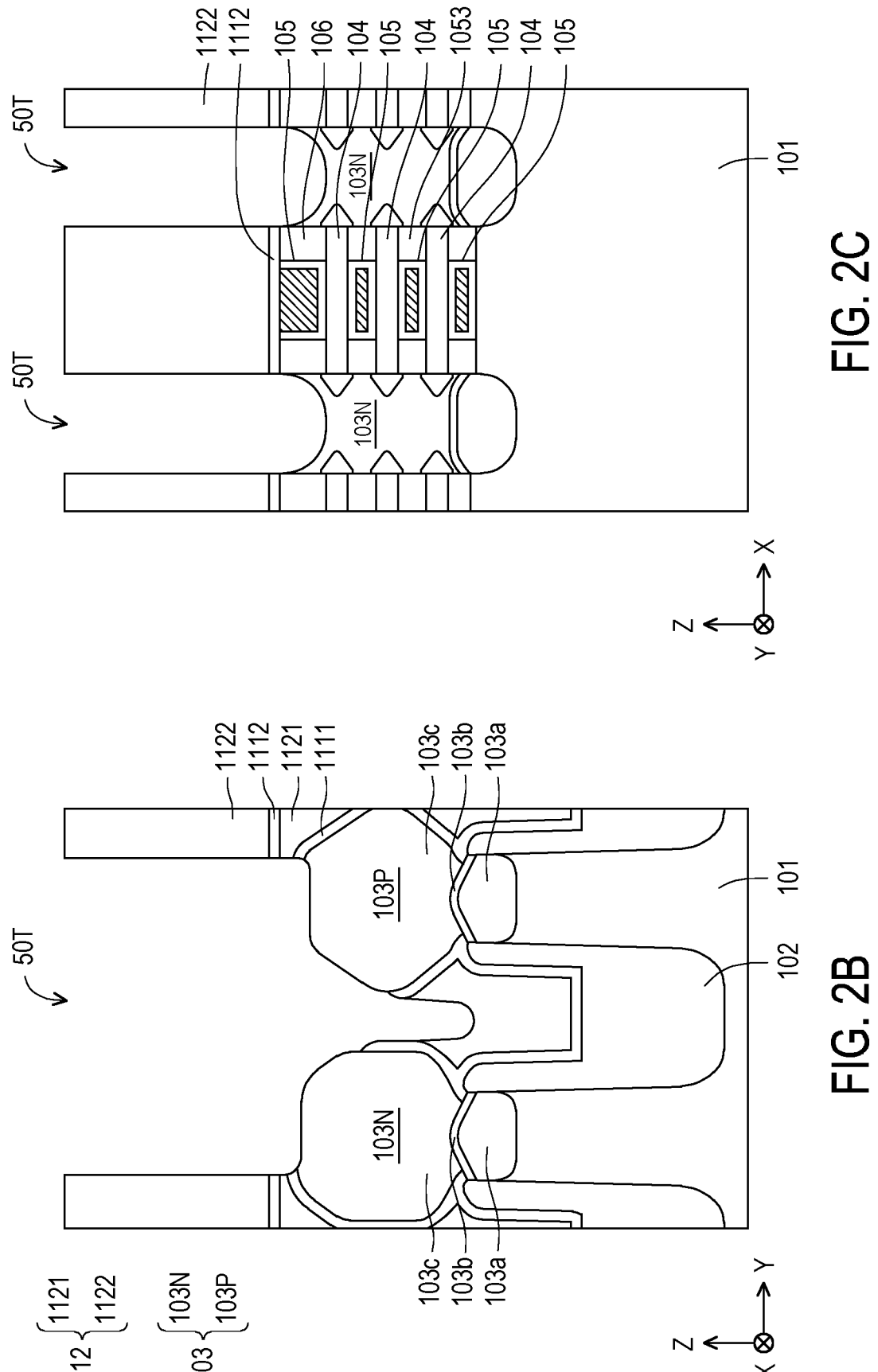

Referring to FIGS. 2A-2C and with reference to FIGS. 1A-1C, the hard mask structure 50 may be patterned using photolithography techniques to form a patterned hard mask structure (not shown). The patterned hard mask structure may be subsequently used to pattern exposed portions of the dielectric structure and the underlying structure to form trenches (or openings or recesses) 50T, thereby defining the space for the subsequently-formed metal contacts. In some embodiments, the trenches 50T are formed by dry etching, wet etching, any other suitable process, or combinations thereof. In some embodiments, the trenches 50T may be strip holes (when viewed from the top) parallel to each other, and closely spaced with respect to each other.

In the Y-Z cross section of FIG. 2B, portions of the second ILD layer 1122, the second ESL 1112, the first ILD layer 1121, and the first ESL 1111 are removed. For example, a portion of the first ESL 1111 is removed to accessibly expose at least a portion of the epitaxial structures 103 (e.g., 103N and 103P). In some embodiments, a top portion of the epitaxial structures 103 is slightly removed during the etching. In some embodiments, the first ILD layer 1121 is partially removed so that the trench 50T spatially separates the epitaxial structure 103N from the epitaxial structure 103P. In the X-Z cross section of FIG. 2C, a portion of the first ESL 1111 overlying the epitaxial structures 103 and the overlying portion of the first ILD layer 1121, the second ESL 1112, and the second ILD layer 1122 are removed to accessibly reveal the top surfaces of the epitaxial structures 103 (e.g., 103N).

Figure 3A:
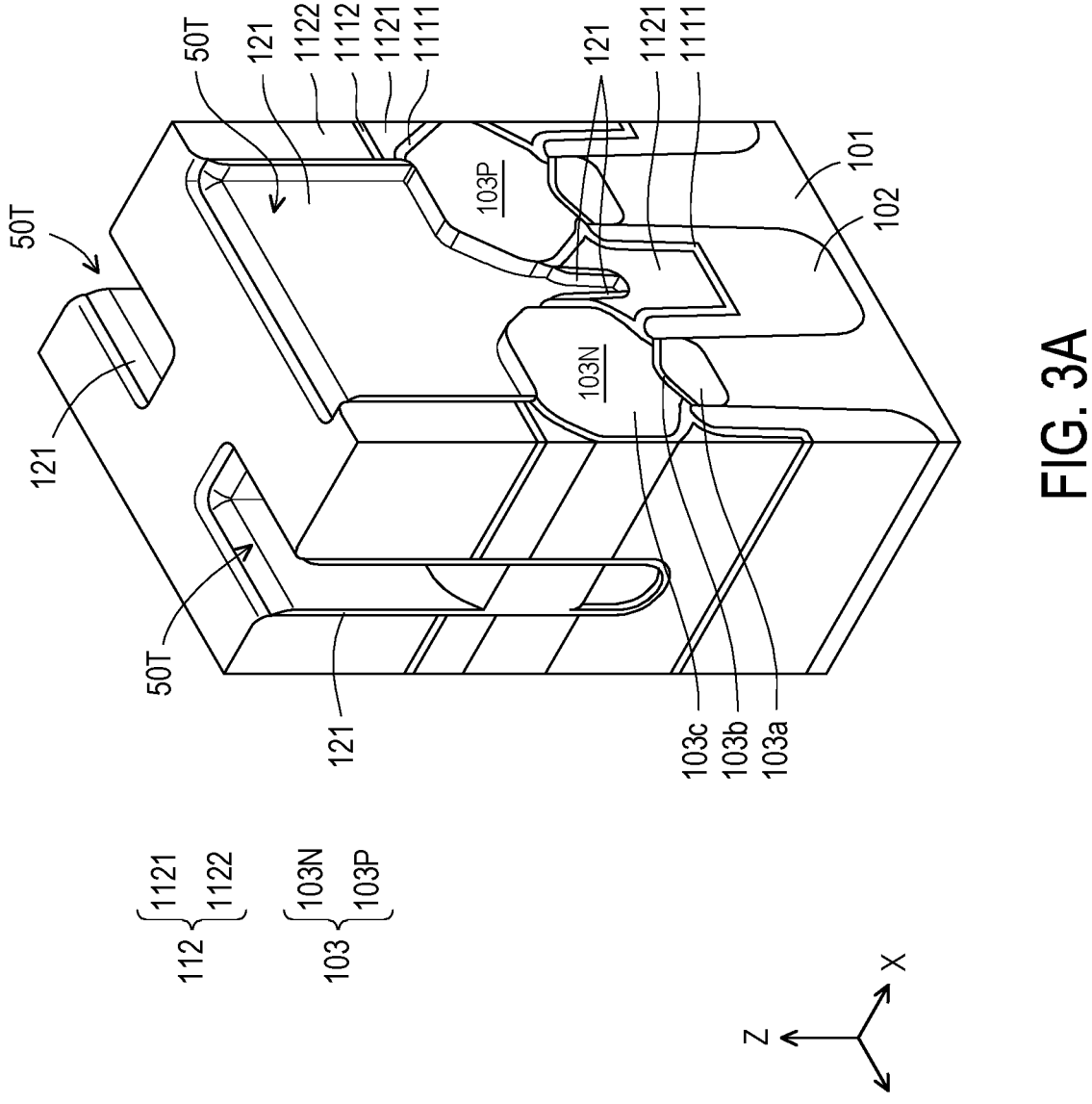
Figures 3B, 3C:
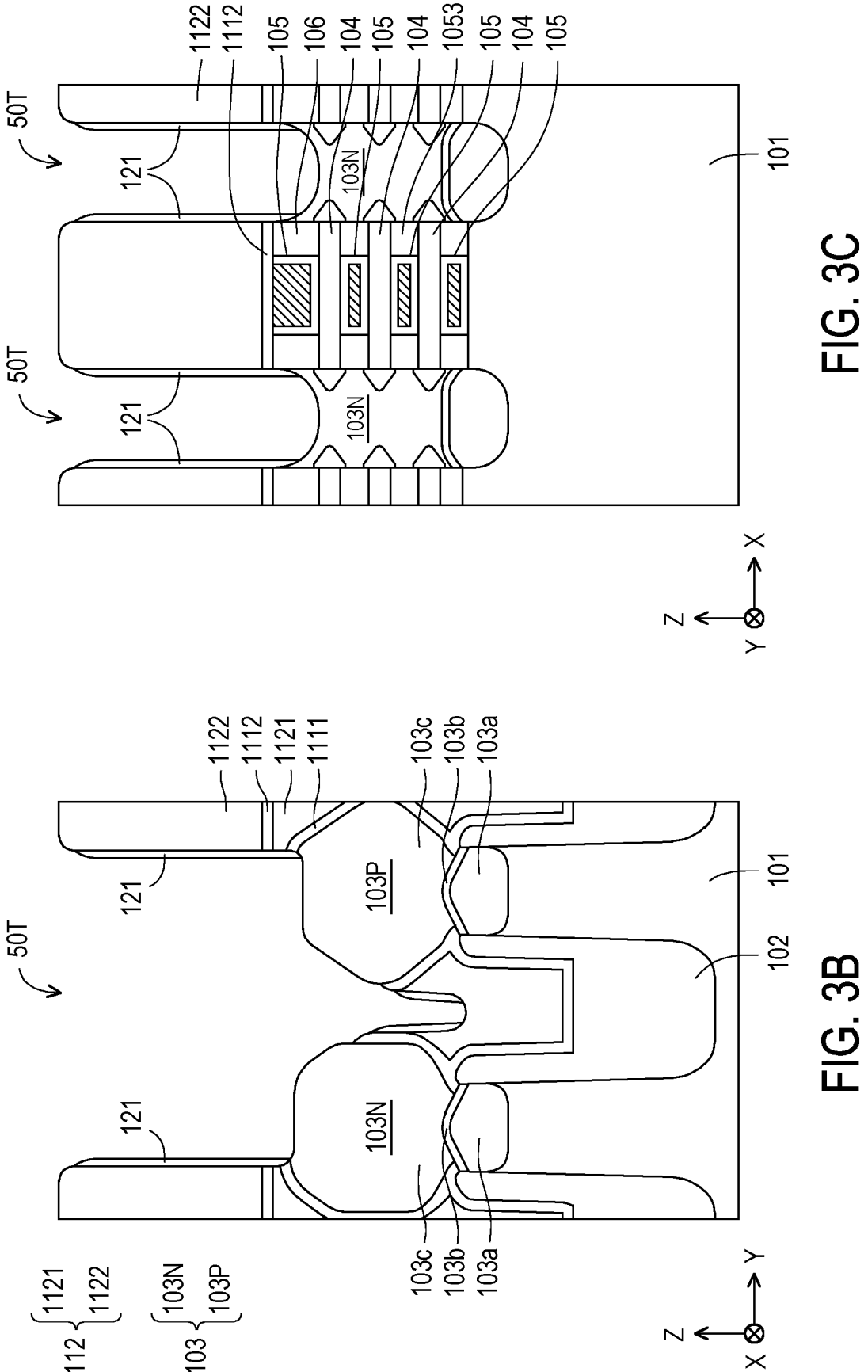

Referring to FIGS. 3A-3C, contact spacers 121 may be formed on the dielectric structure. For example, the contact spacers 121 may be formed on sidewalls of the second ILD layer 1122, the second ESL 1112, the first ILD layer 1121, and the first ESL 1111. The contact spacers 121 may include non-organic dielectric materials such as silicon nitride, silicon oxide, silicon carbide, silicon oxynitride, or the like. In some embodiments, the contact spacers 121 and the second ESL 1112 (and/or the first ESL 1111) may be formed of the same material (or similar materials), and thus no visible interface is formed therebetween. The epitaxial structures 103 may not be covered by the contact spacers 121. For example, at least a portion of the top surfaces of the epitaxial structures 103 may remain being accessibly exposed by the trenches 50T. In the X-Z cross-section of FIG. 3C, the contact spacers 121 formed on the second ILD layer 1122 may extend to cover sidewalls of the gate spacers 106 and may be in direct contact with the periphery of the top surfaces of the epitaxial structures 103. In some embodiments, the thickness of the contact spacers 121 is about 4 nm. Although other value of the spacer's thickness may be employed in accordance with other embodiments.

Figures 4A, 4B:
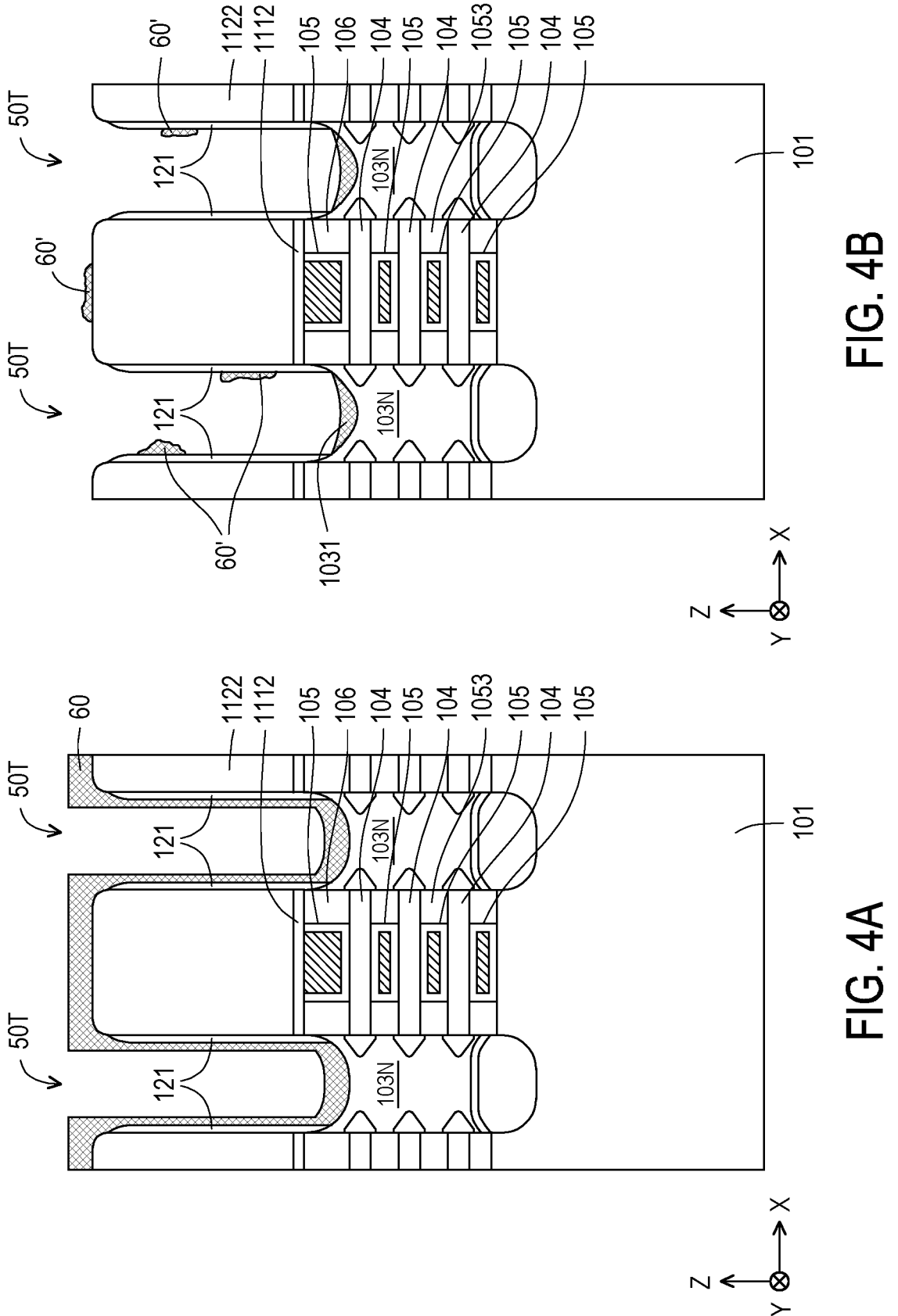

Referring to FIG. 4A, a metallic layer 60 may be conformally formed on the top surface of the second ILD layer 1122 and in the trenches 50T to cover the contact spacers 121 and the epitaxial structures 103. The metallic layer 60 is capable of reacting with the semiconductor materials of the underlying epitaxial structures 103 (e.g., silicon, silicon germanium, germanium, or the like) to form silicide (or germanide) features. The metallic layer 60 may include nickel, cobalt, titanium, tantalum, platinum, tungsten, other noble metals, other refractory metals, rare earth metals or their alloys. The metallic layer 60 may include any suitable material that provides a good ohmic contact at the interface of the gate and S/D electrodes and the subsequently-formed metal interconnects, reducing the contact resistance of the electrodes. For example, nickel and nickel alloy silicide may be used due to their low electrical resistivity, low silicon consumption, good resistance behavior in narrow lines, and low processing temperature.

In some embodiments, the metallic layer 60 of nickel (Ni) with platinum (Pt) (hereinafter NiPt alloy) is formed using a deposition technique including, but not limited to: physical vapor deposition (PVD), chemical vapor deposition (CVD), plasma-assisted CVD, high-density chemical vapor deposition (HDCVD), plating, sputtering, evaporation and chemical solution deposition. In alternative embodiments, the other metal or alloying additive (e.g., Pd, Ti, Zr, Mo, Ta, W, Re, or the like) may be optionally present in the NiPt alloy layer. In some embodiments, as shown in FIG. 4A, the horizontal portions of the metallic layer 60 (e.g., formed on the top surface of the second ILD layer 1122 and the top surface of the epitaxial structures 103) are thicker than the vertical portions of the metallic layer 60 formed on the sidewalls of the contact spacers 121. For example, the thickness of the horizontal portions of the metallic layer 60 is about 6 nm, while the thickness of the vertical portions of the metallic layer 60 is about 1 nm. Other value of the thicknesses may be possible. Alternatively, the thickness of the metallic layer 60 is substantially uniform.

Referring to FIG. 4B, a thermal process may be performed on the metallic layer 60, and the metallic layer 60 may react with the epitaxial structures 103 to form contact features 1031. The contact features 1031 may be or may include silicide regions (e.g., NiSi), germanide regions (e.g., NiGe), or silicon germanide regions (e.g., NiSiGe,) NiSiP, and/or the like. For example, the thermal process may react Ni and Pt with silicon to form various phases of nickel platinum silicide. The thermal process includes annealing, and the annealing temperature may depend on the metallic layer 60. In some embodiments, for NiPt metallic layer, the annealing temperature may range from about 200° C. to about 250° C., and the annealing time may range from about 5 seconds to about 30 seconds. It should be understood that the annealing conditions (e.g., annealing temperature, annealing time, and method of heating) may vary and may influence the silicide feature's thickness, composition, and phase (e.g., grain structure). In some embodiments, a single annealing step is sufficient to form the contact features 1031. Alternatively, some contact features may require more than one annealing step to achieve a desired resistance phase. In some embodiments, after the silicide formation, unreacted metal from the metallic layer 60 may generate metallic residues 60' left on the sidewalls of the contact spacers 121 and/or the top surface of the second ILD layer 1122.

Figure 4C:
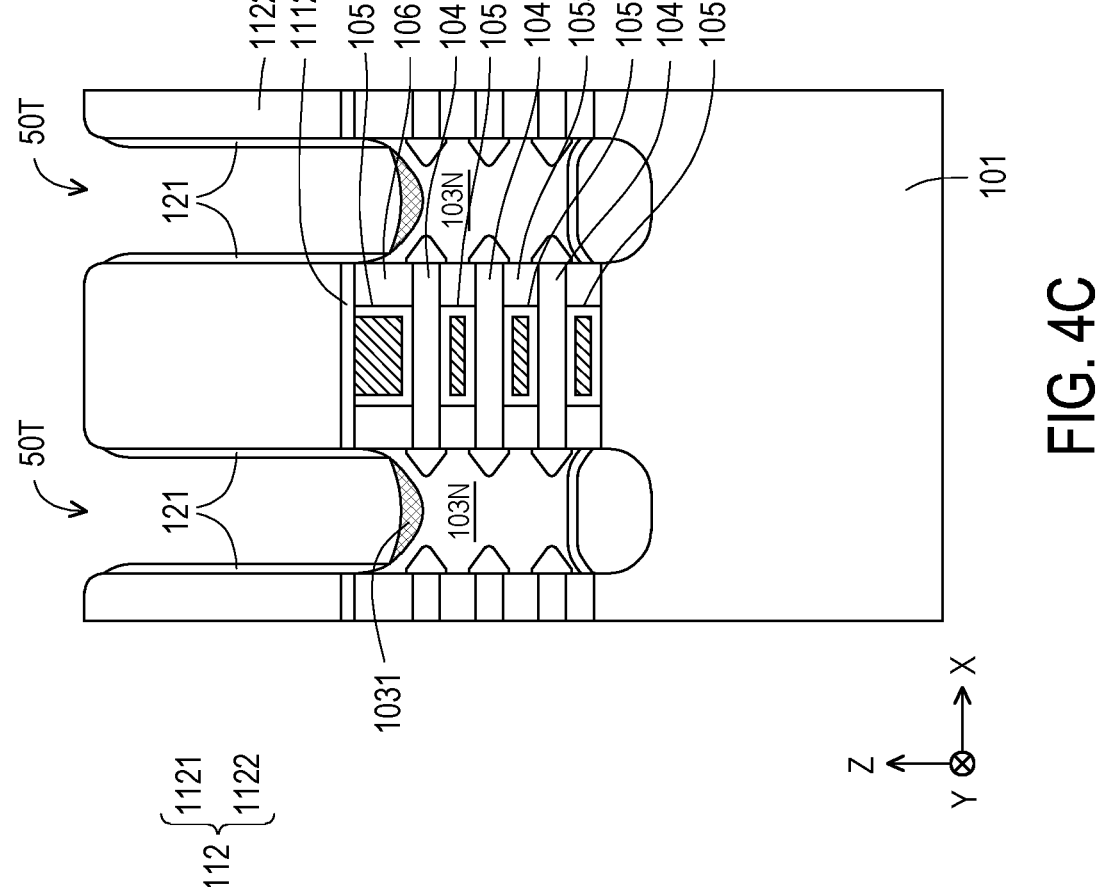

Referring to FIG. 4C and with reference to FIG. 4B, removal of the metallic residues 60' left on the contact spacers 121 and/or the ILD layer 112 may be performed by a selective etching process. The selectivity towards the metallic residues 60' may be much higher, and therefore the metallic residues 60' will be etched faster. That is, the etching process employed is selective to the contact spacers 121 and the ILD layer 112, and thus this etching step does not remove the contact spacers 121 and the ILD layer 112. For example, the selective etching process is performed by using a wet etching. The wet etching may use a mixture of hydrochloric acid (HCl) and ozone ($O_3$) (also referred to as HOM solution), which has an oxidation potential of about 1.45V to 1.6V. The HOM solution may remove remaining metallic residues 60' without damage to the contact spacers 121, the ILD layer 112, and the contact features 1031. In such case, platinum metal may be oxidized by the oxidant to form platinum ions, which are then reacted with chloride ions to form soluble acid. In some embodiments, the wet etching process is performed for about 60 seconds to about 180 seconds at room temperature (e.g., about 25° C., or 25° C. to 27° C.). The etch time depends on the thickness of film to be etched. The details of solution concentration and etching time will be discussed in accompanying with FIG. 6.

Other suitable etch chemistries (e.g., the etchant solution containing perchloric acid ($HClO_4$), the etchant solution containing periodic acid ($H_5IO_6$), and/or the like) may be used as long as the etching provides a structure such as shown in FIG. 4C in which no metallic residues 60' is left on the contact spacers 121 and/or the ILD layer 112, and the contact spacers 121 remain intact. In some embodiments, an etchant solution including an acid and an oxidizing agent having an oxidation potential at least (or greater than) 1.4V may be used at this stage. In some embodiments, after the etching, the structure is removed from the bath containing the etchant solution and rinsed with deionized water. In some embodiments, after the rinsing, the structure may be dried using any suitable drying techniques including, but not limited to, air drying, vacuum drying or oven drying.

Figure 5A:
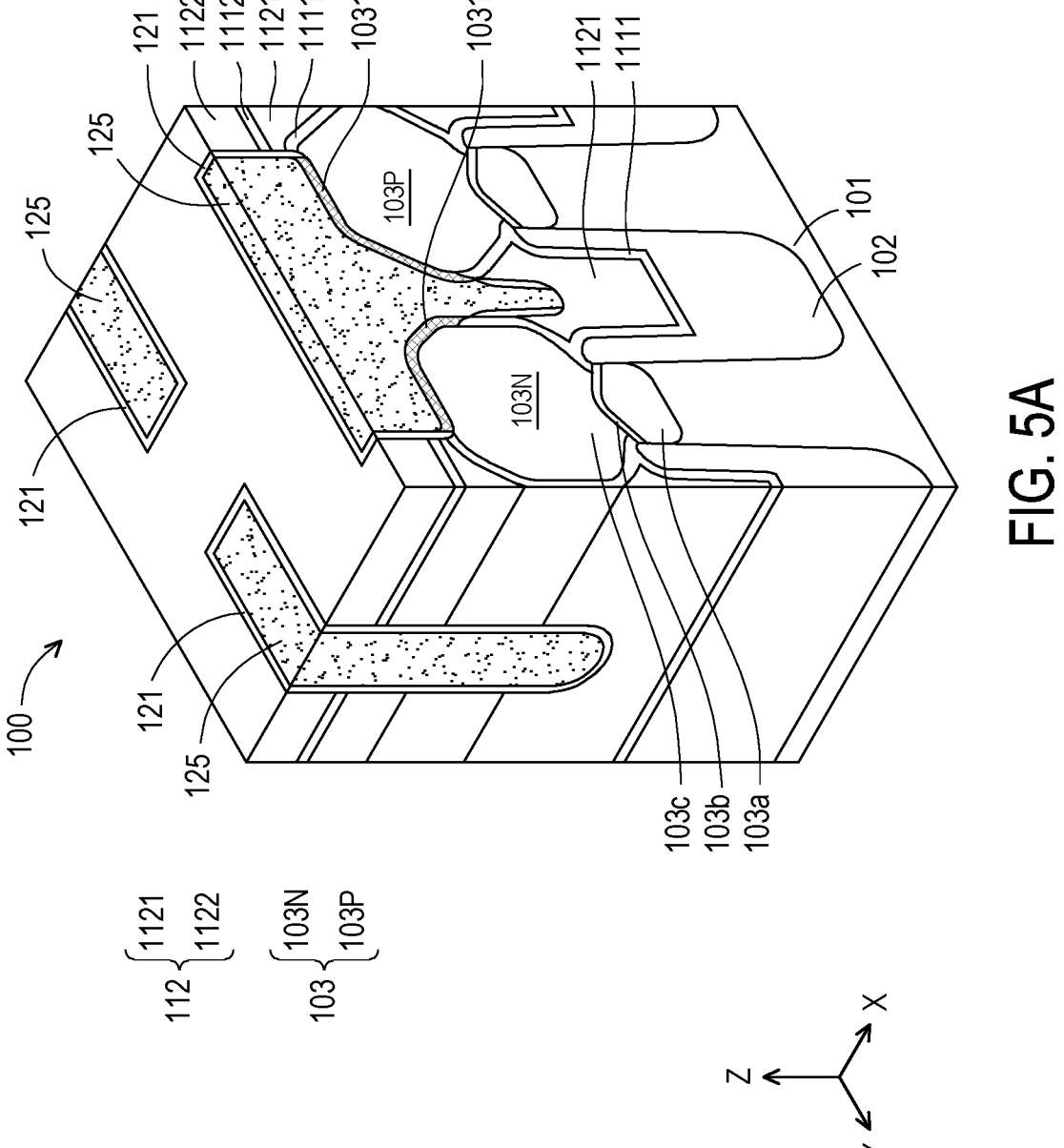
Figures 5B, 5C:
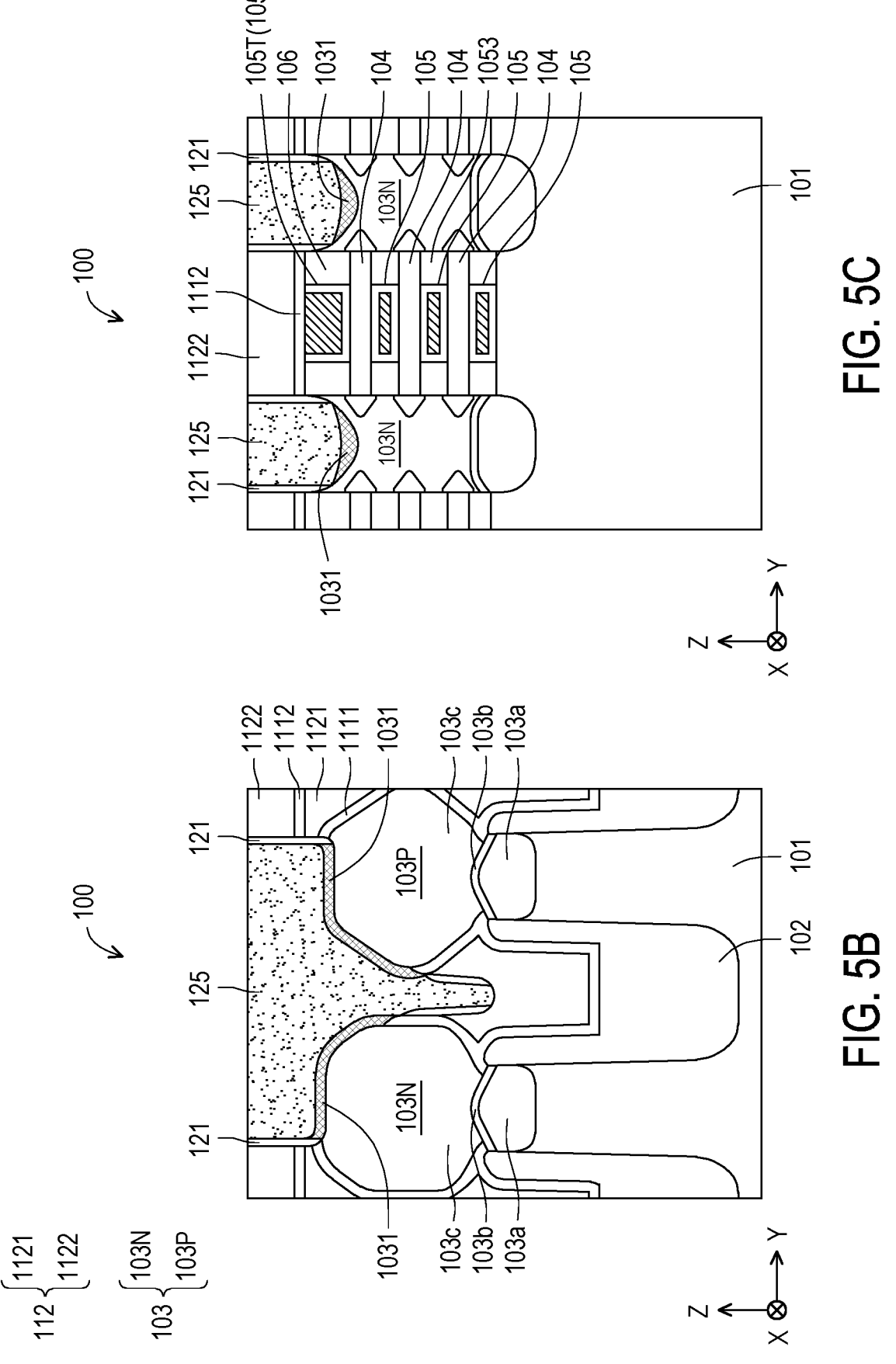

Referring to FIGS. 5A-5C and with reference to FIG. 4C, metal contacts 125 may be formed in the trenches 50T to form a semiconductor device 100. The respective metal contact 125 may be laterally surrounded by the contact spacers 121 so that the sidewalls of the respective metal contact 125 are in direct contact with the contact spacers 121. In some embodiments, each metal contact 125 includes one or more layers, such as barrier layers, diffusion layers, and conductive fill materials. The barrier layer (not individually shown) may include titanium, titanium nitride, tantalum, tantalum nitride, or the like. The conductive fill material may be copper, a copper alloy, silver, gold, tungsten, cobalt, aluminum, nickel, or the like. The metal contacts 125 are each electrically coupled to the underlying conductive feature (e.g., the contact features 1031 overlying the epitaxial structures 103). For example, the horizontal portions (e.g., bottom/lower surfaces) of the metal contacts 125 may be in direct contact with the contact features 1031. Since the metal contacts 125 are electrically coupled to the epitaxial structures 103, the metal contacts 125 may be referred to as S/D contacts.

In the Y-Z cross section of FIG. 5B, a bottom portion of the metal contact 125 extends into the space between two adjacent epitaxial structures 103, and the bottommost surface of the metal contact 125 is in direct contact with the first ILD layer 1121. In some embodiments, a planarization process (e.g., a chemical mechanical polish (CMP), an etch-back process, combinations thereof, or the like) may be performed to remove excess portions of the metal contacts 125, which excess portions are over top surfaces of the second ILD layer 1122. For example, the top surfaces of the metal contacts 125 are substantially leveled with the top surfaces of the contact spacers 121 and the top surface of the second ILD layer 1122.

In some embodiments, the semiconductor device 100 includes gate contacts (not shown) passing through the second ILD layer 1122 and the second ESL 1112 to be in contact with the topmost gate structure 105T. The gate contacts may be formed at the same process of the formation of the S/D contacts. Alternatively, the gate contacts may be formed after (or before) forming the S/D contacts. In some embodiments, the semiconductor device 100 further includes a front-side interconnect structure (not shown) formed on the second ILD layer 1122 to be electrically connected to the S/D contacts and the gate contacts. The front-side interconnect structure may include one or more layers of conductive features embedded in one or more stacked dielectric layers and may be formed by using back end of line (BEOL) technique. It should be noted that the semiconductor device 100 illustrated herein is merely an example, more elements or few elements may be formed in the semiconductor device 10.

Figure 6A:
FIG. 6A is a graph comparison showing the removal efficiency of nickel (Ni) and platinum (Pt) using various etchant chemistries, in accordance with some embodiments.
Figure 6B:
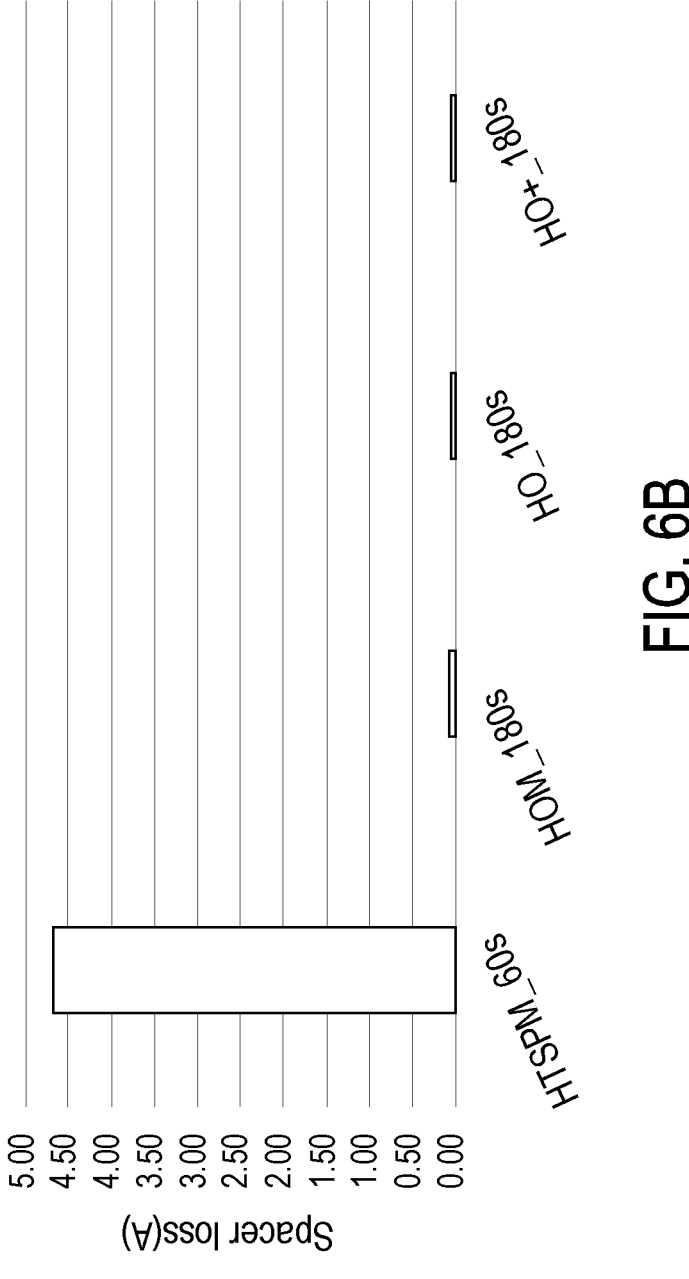
FIG. 6B is a graph comparison showing the loss of contact spacer after using various etchant chemistries, in accordance with some embodiments.

FIG. 6A is a graph comparison showing the removal efficiency of nickel (Ni) and platinum (Pt) using various etch chemistries, and FIG. 6B is a graph comparison showing the loss of contact spacer after using various etch chemistries, in accordance with some embodiments.

Referring to FIG. 6A and with reference to FIGS. 4B-4C, in the case of example 1, removal of the unreacted NiPt metallic residues 60' on the contact spacers 121 and the second ILD layer 1122 is performed by etching the metallic residues 60' with a bath containing the etchant solution (hydrochloric acid (HCl)), and etching occurs for a time period of about 60 seconds. After treatment, an element analysis of the structure, using X-rays photoelectron spectroscopic (XPS) analysis, showed that the structure exhibited over 1 atomic percent (at %) of Ni and Pt still left on the structure. In the case of example 2, removal of the unreacted NiPt metallic residues 60' is performed by using the HOM solution for about 60 seconds. The HOM solution used in this case is an aqueous solution of hydrochloric acid (HCl)—ozone ($O_3$)—water mixture in a mixing ratio (volume ratio) of (HCl:O3:$H_2O$) is about 1:2:3. The XPS analysis showed that the structure exhibited over 0.8 at % of Ni and over 0.4 at % of Pt left on the structure.

It is also found that the HO solution (i.e. HCl+$O_3$ without adding water, a volume ratio of (HCl:$O_3$)=1:2) may be a suitable etchant solution used to remove the NiPt metallic residues 60'. In the case of example 3, using the same etchant solution as example 2, but the etching time lasts about 180 seconds. After treatment, the XPS analysis showed that the structure exhibited less at % of Ni and Pt left on the structure, as compared to example 2. It is found that when the reaction time increases, the removal efficiency of Ni and Pt may be improved as using the HOM solution as the etchant solution.

In the case of example 4 and the case of example 5, different volume ratio solutions of the HOM solution may be used. For example, in these two cases, the HOM solution is still used as the base etchant solution and the etching time is about 180 seconds. The difference is that in the case of example 4 additional $O_3$ is added into the HOM solution, while in the case of example 5 additional HCl is added into the HOM solution. In the case of example 4, the etching mixture is an aqueous solution with a mixing ratio (HCl:$O_3$:$H_2O$)=1:4:5. In the case of example 5, the etching mixture is an aqueous solution with a mixing ratio (HCl:$O_3$:$H_2O$)=2:1:4. After treatment, the XPS analysis showed that the structure in the case of example 5 exhibited better removal efficiency of Ni and Pt, especially improved the removal of Pt. It is also found that the HCl+HOM solution without adding water (i.e. a volume ratio of (HCl:$O_3$)=2:1) is a suitable etchant solution to remove the NiPt metallic residues 60'.

On the other hand, a dilute sulfuric peroxide mixture (dSPM) in a mixing ratio ($H_2SO_4$:$H_2O_2$)=9:1 is applied to the structure in the case of example 6 for about 60 seconds. In addition, in the case of example 7, a high temperature sulfuric peroxide mixture (HTSPM) in a mixing ratio ($H_2SO_4$:$H_2O_2$)=2.4:1 is applied to the structure at high temperature of about 150° C. to about 190° C. for about 60 seconds. After treatment, the XPS analysis showed that the structure in the case of example 7 exhibited better removal efficiency of Ni and Pt. However, the contact spacers 121 may be etched during the etching process as using the dSPM/HTSPM solution.

Referring to FIG. 6B and with reference to FIGS. 4B-4C, in the case of example 1, after using the HTSPM solution to etch the NiPt metallic residues 60', the contact spacers 121 having the thickness over 4.5 angstrom have been removed together with the metallic residues 60', where the contact spacers 121 are formed of silicon nitride. This may cause unwanted enlargement of the trenches 50T or even damage to the topmost gate structures 105, resulting in increasing the risk of leakage. On the other hand, in the case of example 2-4, after using the HOM solution, the HO solution (i.e. HCl+$O_3$ without adding water), or the HO+ solution (i.e. HCl+ more $O_3$ without adding water) as the etchant solution, the contact spacers 121 may remain substantially intact.

Based on the results shown in FIGS. 6A-6B, it is found that the suitable etchant chemistries for removing the unreacted NiPt metallic residues 60' without damaging the contact spacers 121 include the HOM solution and the HO solution. For example, one of the suitable etchant chemistries for removing NiPt metallic residues 60' is the volume ratio of the HOM solution (HCl:$O_3$:$H_2O$)=2:1:4 (or 1:2:3). Another one of the suitable etchant chemistries for removing NiPt metallic residues 60' includes the volume ratio of the HO solution (HCl:$O_3$)=2:1 (or 1:2). The etching process for removing the unreacted NiPt metallic residues 60' may be performed using the HOM solution (or the HO solution) at the room temperature (e.g., about 25° C. or about 25~27° C.) for about 60 seconds to about 180 seconds to efficiently remove the unreacted NiPt metallic residues 60'. It is found that after treatment, the processed structure are analyzed using transmission electron microscopy (TEM), and the results showed that any remaining unreacted NiPt metallic residues 60' has been removed.

According to some embodiments, a method of forming a semiconductor device includes forming an epitaxial source/drain (S/D) structure adjacent to a gate structure; forming a dielectric structure over the gate structure and the epitaxial S/D structure; forming a trench in the dielectric structure to accessibly expose at least a portion of the epitaxial S/D structure; forming a contact feature from the portion of the epitaxial S/D structure within the trench; and forming a S/D contact in the trench to be in contact with the contact feature overlying the epitaxial S/D structure. Forming the contact feature includes forming a metallic layer in the trench; performing a thermal process on the metallic layer to form the contact feature, where after the thermal process, metallic residues remain on a sidewall of a spacer of the dielectric structure in the trench; and removing the metallic residues by using a wet etching process, wherein the spacer of the dielectric structure remains substantially intact.

According to some alternative embodiments, a method of forming a semiconductor device includes covering an epitaxial source/drain (S/D) structure and a gate structure with a dielectric structure; forming a trench in the dielectric structure to accessibly expose at least a portion of the epitaxial S/D structure; forming a metallic layer in the trench; annealing the metallic layer to form a contact feature from the portion of the epitaxial S/D structure within the trench, wherein after the annealing, metallic residues remain on a sidewall of the dielectric structure in the trench; etching the metallic residues by an etchant solution having an oxidation potential at least 1.4V; and forming a S/D contact in the trench to be in contact with the contact feature overlying the epitaxial S/D structure.

According to some alternative embodiments, a method of forming a semiconductor device includes forming a trench in a dielectric structure that covers an epitaxial source/drain (S/D) structure and a gate structure to accessibly expose at least a portion of the epitaxial S/D structure, where the gate structure is formed over channel regions of semiconductor nanosheets and the epitaxial S/D structure is formed adjacent to the gate structure and the channel regions; forming a metallic layer in the trench; reacting the metallic layer with the epitaxial S/D structure to form a silicide feature, wherein after the reacting, metallic residues remain on a sidewall of a spacer of the dielectric structure in the trench; selectively removing the metallic residues without damaging the spacer of the dielectric structure through a wet etching process; and forming a metal contact in the trench to be in contact with the silicide feature overlying the epitaxial S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming semiconductor channel layers over a semiconductor substrate, wherein the semiconductor channel layers are vertically stacked and separate apart from one another;

forming an epitaxial source/drain (S/D) structure on the semiconductor substrate, wherein the epitaxial S/D structure is laterally coupled to the semiconductor channel layers;

forming a gate structure around the semiconductor channel layers;

forming a dielectric structure over the gate structure and the epitaxial S/D structure;

forming a trench in the dielectric structure to accessibly expose at least a portion of the epitaxial S/D structure;

forming a contact feature from the portion of the epitaxial S/D structure within the trench comprising:

forming a metal layer in the trench;

performing a thermal process on the metal layer to form the contact feature, wherein after the thermal process and before a wet etching process, metal residues remain on a sidewall of a spacer of the dielectric structure in the trench to expose portions of the spacer of the dielectric structure in the trench; and removing the metal residues by using the wet etching process, wherein the spacer of the dielectric structure remains substantially intact; and forming a S/D contact in the trench to be in contact with the contact feature overlying the epitaxial S/D structure.

2. The method of claim 1, wherein an etching solution used in the wet etching process has an oxidation potential at least 1.4V.

3. The method of claim 1, wherein an etching solution used in the wet etching process is a mixture of hydrochloric acid (HCl) and ozone ($O_3$).

4. The method of claim 3, wherein a volume ratio of HCl:$O_3$ is 1:2 or 2:1.

5. The method of claim 1, wherein the wet etching process is performed using an etching solution at a room temperature for about 60 seconds to about 180 seconds.

6. The method of claim 1, wherein the metal layer comprises nickel and platinum.

7. The method of claim 1, wherein after forming the metal layer, a portion of the metal layer formed on a top surface of the dielectric structure is thicker than a portion of the metal layer formed on the sidewall of the spacer of the dielectric structure.

8. The method of claim 1, wherein the contact feature from the portion of the epitaxial S/D structure is a silicide feature or a germanide feature.

9. The method of claim 1, wherein the gate structure comprises a plurality of segments, the segments and the semiconductor channel layers are arranged in an alternating manner in a cross-sectional view.

10. A method of forming a semiconductor device, comprising:

forming an epitaxial source/drain (S/D) structure to be in lateral contact with semiconductor channel layers, wherein the semiconductor channel layers are vertically separated from one another;

forming a gate structure around the semiconductor channel layers;

covering the epitaxial S/D structure and the gate structure with a dielectric structure;

forming a trench in the dielectric structure to accessibly expose at least a portion of the epitaxial S/D structure;

forming a metal layer in the trench;

annealing the metal layer to form a contact feature from the portion of the epitaxial S/D structure within the trench and metal residues remaining on a sidewall of a spacer of the dielectric structure in the trench, wherein after the annealing and before etching the metal residues, the metal residues expose portions of the spacer of the dielectric structure in the trench;

etching the metal residues by an etchant solution having an oxidation potential at least 1.4V; and forming a S/D contact in the trench to be in contact with the contact feature overlying the epitaxial S/D structure.

11. The method of claim 10, wherein the etching solution is a mixture of hydrochloric acid and ozone.

12. The method of claim 10, wherein etching the metal residues is performed at a room temperature for about 60 seconds to about 180 seconds.

13. The method of claim 10, wherein the metal layer comprises nickel and platinum.

14. The method of claim 10, wherein the contact feature from the portion of the epitaxial S/D structure is a silicide feature or a germanide feature.

15. The method of claim 10, wherein after etching the metal residues, the spacer of the dielectric structure where the metal residues were formed on remains substantially intact.

16. A method of forming a semiconductor device, comprising:

forming an epitaxial source/drain (S/D) structure to be in lateral contact with semiconductor channel layers along a first direction, wherein the semiconductor channel layers are separated from one another in a second direction that is substantially perpendicular to the first direction;

forming a gate structure around the semiconductor channel layers;

forming a trench in a dielectric structure that covers the epitaxial S/D structure and the gate structure to accessibly expose at least a portion of the epitaxial S/D structure;

forming a contact spacer on the dielectric structure and in the trench, wherein the contact spacer lands on a periphery of a top surface of the portion of the epitaxial S/D structure;

forming a metal layer in the trench;

reacting the metal layer with the epitaxial S/D structure to form a silicide feature, wherein after the reacting and before a wet etching process, metal residues remain on a sidewall of the contact spacer in the trench to expose portions of the contact spacer in the trench;

selectively removing the metal residues without damaging the contact spacer through the wet etching process; and forming a metal contact in the trench to be in contact with the contact spacer and the silicide feature overlying the epitaxial S/D structure.

17. The method of claim 16, wherein an etching solution used in the wet etching process has an oxidation potential at least 1.4V.

18. The method of claim 16, wherein an etching solution used in the wet etching process is a mixture of hydrochloric acid and ozone.

19. The method of claim 16, wherein the wet etching process is performed using an etching solution at a room temperature for about 60 seconds to about 180 seconds.

20. The method of claim 16, wherein the silicide feature is located below the contact spacer.

\* \* \* \* \*